(12) United States Patent
Bok et al.

(10) Patent No.: US 11,227,898 B2
(45) Date of Patent: Jan. 18, 2022

(54) DISPLAY APPARATUS

(71) Applicant: Samsung Display Co., Ltd., Yongin-si (KR)

(72) Inventors: Seung Lyong Bok, Yongin-si (KR); Hee June Kwak, Yongin-si (KR); Mu Gyeom Kim, Yongin-si (KR); Min Soo Kim, Yongin-si (KR); Won Ki Hong, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/659,931

(22) Filed: Jul. 26, 2017

(65) Prior Publication Data

US 2018/0033837 A1 Feb. 1, 2018

(30) Foreign Application Priority Data

Jul. 26, 2016 (KR) .................. 10-2016-0094986

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/32* | (2006.01) |
| *G09G 3/3233* | (2016.01) |

(Continued)

(52) U.S. Cl.
CPC ........ *H01L 27/3211* (2013.01); *G09G 3/3233* (2013.01); *H01L 25/048* (2013.01); *H01L 27/3248* (2013.01); *H01L 27/3267* (2013.01); *G09G 3/3291* (2013.01); *H01L 27/1214* (2013.01)

(58) Field of Classification Search
CPC .... G06F 1/1616; G06F 1/1641; G06F 1/1643; G06F 1/1677; G06F 1/1694; G06F 2203/0381; G06F 3/013; G06F 3/03; G06F 3/0412; G06F 3/0416; G06F 3/042; G06F 3/0488; G06F 3/044; G09G 5/373; G09G 3/3233; G09G 3/3291; H04M 1/0229; H04M 1/0243; H04M 2250/16; H04M 2250/22; H04M 2250/52; G02B 2027/0132; G02B 2027/0178; G02B 27/0172; H01L 27/1214; H01L 27/124; H01L 27/1262; H01L 27/3211; H01L 27/3248

See application file for complete search history.

(56) References Cited

U.S. PATENT DOCUMENTS

| | | |
|---|---|---|
| 5,703,436 A | 12/1997 | Forrest et al. |
| 7,679,093 B2 | 3/2010 | Park et al. |

(Continued)

FOREIGN PATENT DOCUMENTS

| | | |
|---|---|---|
| KR | 10-0685844 A | 2/2007 |
| KR | 10-2017-0047542 A | 5/2017 |
| KR | 10-2014-0073216 A | 6/2017 |

*Primary Examiner* — Meiya Li
(74) *Attorney, Agent, or Firm* — Innovation Counsel LLP

(57) ABSTRACT

A display apparatus includes: a first substrate having a front surface and a rear surface; a first display layer disposed on the front surface of the first substrate, the first display layer configured to emit light in a front direction; a second display layer disposed on the rear surface of the first substrate, the second display layer configured to emit light in a rear direction; and a pressure sensor disposed on the rear surface of the first substrate, the pressure sensor configured to sense a pressure of a touch of a user.

12 Claims, 14 Drawing Sheets

(51) Int. Cl.
*H01L 25/04* (2014.01)
*G09G 3/3291* (2016.01)
*H01L 27/12* (2006.01)

(56) References Cited

U.S. PATENT DOCUMENTS

| | | | |
|---|---|---|---|
| 8,723,813 B2 | 5/2014 | Park et al. | |
| 8,979,291 B2 | 3/2015 | Hack et al. | |
| 9,024,907 B2 | 5/2015 | Bolender | |
| 9,059,433 B2 | 6/2015 | Yim et al. | |
| 9,229,589 B2 | 1/2016 | Lee et al. | |
| 2006/0197753 A1 | 9/2006 | Hotelling | |
| 2012/0313860 A1* | 12/2012 | Hashimura | B82Y 15/00 345/173 |
| 2015/0352437 A1 | 12/2015 | Koseki et al. | |
| 2015/0378465 A1 | 12/2015 | Shih et al. | |
| 2016/0060467 A1 | 3/2016 | Tungare et al. | |
| 2016/0149164 A1* | 5/2016 | Lee | H01L 51/56 257/40 |
| 2017/0115785 A1 | 4/2017 | Seo et al. | |
| 2017/0277317 A1* | 9/2017 | Lee | G06F 3/0412 |
| 2017/0308345 A1* | 10/2017 | He | G06F 3/0346 |
| 2018/0182816 A1* | 6/2018 | Kang | G06F 3/0446 |
| 2019/0121465 A1* | 4/2019 | Seo | G06F 3/044 |

\* cited by examiner

DISPLAY APPARATUS

RELATED APPLICATIONS

The present application claims priority to Korean Patent Application No. 10-2016-0094986, filed on Jul. 26, 2016, in the Korean Intellectual Property Office, the entire disclosure of which is incorporated by reference herein.

BACKGROUND

1. Field

An aspect of the present disclosure relates to a display apparatus.

2. Description of the Related Art

As smart devices are developed, display apparatuses satisfying various requests of users have been developed. For example, a study for improving the display direction of a display apparatus, a study for enabling a user to obtain visual information from a display apparatus even when the display apparatus does not emit light, a study for enabling a display apparatus to measure a pressure of a touch, and the like have been developed.

SUMMARY

Embodiments provide a display apparatus that provides visual information in various directions and measure a pressure of a touch.

According to an aspect of the present disclosure, there is provided a display apparatus including: a first substrate having a front surface and a rear surface; a first display layer disposed on the front surface of the first substrate, the first display layer configured to emit light in a front direction; a second display layer disposed on the rear surface of the first substrate, the second display layer configured to emit light in a rear direction; and a pressure sensor disposed on the rear surface of the first substrate, the pressure sensor configured to sense a pressure of a touch of a user.

The pressure sensor may include an elastic layer disposed between the first substrate and the second display layer, the elastic layer being configured to be deformed by the pressure.

The elastic layer may include nanoparticles having conductivity.

The pressure sensor may further include: a first conductive pattern disposed between the first substrate and the elastic layer; and a second conductive pattern disposed between the elastic layer and the second display layer.

The display apparatus may further include: a second substrate disposed between the first conductive pattern and the elastic layer; a third substrate disposed between the elastic layer and the second conductive pattern; and a fourth substrate disposed between the second conductive pattern and the second display layer.

An area of the second substrate may be larger than an area of the first substrate. An area of the third substrate may be larger than an area of the fourth substrate. The display apparatus may further include: a first conductive pad provided on a same plane as the first conductive pattern, the first conductive pad being connected to the first conductive pattern; and a second conductive pad provided on a same plane as the second conductive pattern, the second conductive pad being connected to the second conductive pattern.

The first substrate may have a first via hole. The fourth substrate may have a second via hole. The first conductive pattern may be connected to an external apparatus through the first via hole. The second conductive pattern may be connected to the external apparatus through the second via hole.

The display apparatus may further include: a second substrate disposed between the first substrate and the first conductive pattern; a third substrate disposed between the elastic layer and the second display layer; and a fourth substrate disposed between the third substrate and the second display layer.

The display apparatus may further include a first reflective layer disposed on the first display layer. The first display layer may be disposed between the first substrate and the first reflective layer.

The first substrate may include a light emitting area and a reflective area. The first reflective layer may include: a sensing pattern disposed in the light emitting area and the reflective area, the sensing pattern including a material having a constant reflexibility, the sensing pattern configured to sense a position of the touch; and a reflective pattern disposed in the reflective area, the reflective pattern overlapping with the sensing pattern.

Each of the first conductive pattern and the second conductive pattern may be provided in plurality.

According to another aspect of the present disclosure, there is provided a display apparatus including: a substrate having a front surface and a rear surface; a display layer disposed on the front surface of the substrate, the display layer configured to emit light in front and rear directions; and a pressure sensor disposed on the display layer, the pressure sensor configured to sense a pressure of a touch of a user.

The display layer may include: first and second pixel electrodes disposed on the front surface of the substrate; a counter electrode disposed on the first and second pixel electrodes; and an emitting layer provided between the first pixel electrode and the counter electrode and between the second pixel electrode and the counter electrode.

The display apparatus may further include a rear reflective layer disposed between the substrate and the first pixel electrode and a front reflective layer disposed on the counter electrode. The pressure sensor may be provided on the front reflective layer, have elasticity, and be configured to be deformed by the pressure of the touch.

The pressure sensor may be provided in plurality. Each of the plurality of pressure sensors may include grid type patterns extending in a first direction and a second direction intersecting the first direction.

The display apparatus may further include a planarization layer provided between the display layer and the pressure sensor.

The display apparatus may further include a connection line disposed on a same plane as the pressure sensor, the connection line being connected to the pressure sensor.

The display apparatus may further include a reflective layer disposed on the pressure sensor.

The substrate may include a light emitting area and a reflective area. The reflective layer may include: a sensing pattern disposed in the light emitting area and the reflective area, the sensing pattern including a material having a constant reflexibility, the sensing pattern configured to sense a position of the touch; and a reflective pattern disposed in the reflective area, the reflective pattern overlapping with the sensing pattern.

The display apparatus may further include a polarizing plate disposed on the pressure sensor.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
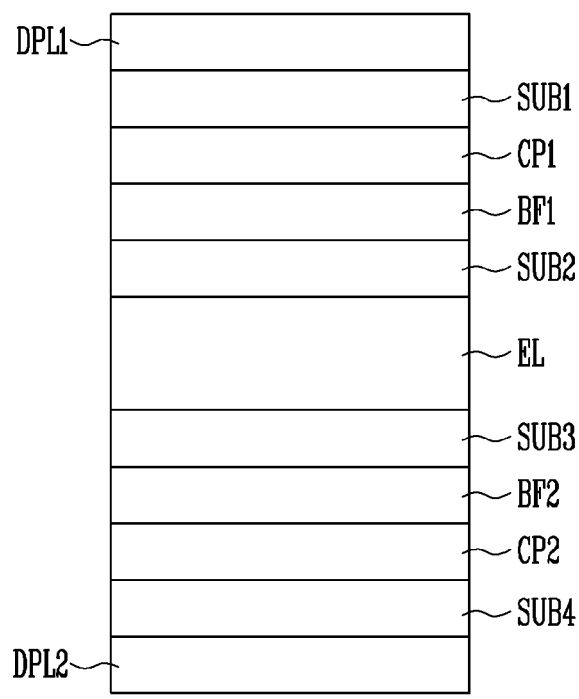
FIG. 1 is a view illustrating a display apparatus according to an embodiment of the present disclosure.

Hereinafter, exemplary embodiments of the present disclosure will be described in detail with reference to the accompanying drawings. Like reference numerals indicate like elements throughout the specification and drawings. In the following description, detailed explanation of known related functions and constitutions may be omitted to avoid unnecessarily obscuring the subject manner of the present disclosure. Names of elements used in the following description are selected in consideration of facility of specification preparation. Thus, the names of the elements may be different from names of elements used in a real product.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

FIG. 1 is a view illustrating a display apparatus according to an embodiment of the present disclosure.

Referring to FIG. 1, the display apparatus according to the embodiment of the present disclosure includes a first substrate SUB1, a first display layer DPL1, a second display layer DPL2, a first conductive pattern CP1, a second substrate SUB2, an elastic layer EL, a third substrate SUB3, a second conductive pattern CP2, a fourth substrate SUB4, a first buffer layer BF1, and a second buffer layer BF2.

The first substrate SUB1 has a front surface and a rear surface. The first substrate SUB1 may allow light to be transmitted therethrough, and have an insulation property. The first substrate SUB1 may include an insulative material such as glass, organic polymer, crystal, quartz, synthetic quartz, calcium fluoride, F-doped quartz, sodalime glass, or non-alkali glass. Also, the first substrate SUB1 may have flexibility to be bendable or foldable. In this case, the first substrate SUB1 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The first display layer DPL1 is disposed on the front surface of the first substrate SUB1, and emits light in a front direction. The first display layer DPL1 may be connected to an external apparatus (not shown), and the external apparatus (not shown) may drive the first display layer DPL1.

The second display layer DPL2 is disposed on the rear surface of the first substrate SUB1, and emits light in a rear direction. The second display layer DPL2 may be connected to an external apparatus (not shown), and the external apparatus (not shown) may drive the second display layer DPL2.

The first conductive pattern CP1 is disposed between the first substrate SUB1 and the second display layer DPL2. The first conductive pattern CP1 may include at least one of a metal (aluminum, gold, nickel, titanium, platinum, chromium, copper, etc., or any alloy thereof) having ductility and a transparent conductive oxide (indium tin oxide, indium zinc oxide, aluminum doped zinc oxide, gallium indium zinc oxide, zinc oxide, etc., or any mixture thereof) having no ductility. When the first substrate SUB1 has flexibility, the first conductive pattern CP1 may include a metal (aluminum, gold, nickel, titanium, platinum, chromium, copper, etc., or any alloy thereof) having ductility.

The elastic layer EL is disposed between the first conductive pattern CP1 and the second display layer DPL2. The elastic layer EL has elasticity, and may be deformed by a pressure of a touch when a user applies the touch to the display apparatus. The elastic layer EL may include silicon, polymer, and the like. The polymer may include at least one of polyimide and polyurethane.

Also, the elastic layer EL may include nanoparticles. The nanoparticles may have conductivity, and include particles of carbon, graphite, metalloid, metal, conductive oxide of the metalloid or metal, or conductive nitride of the metalloid or metal. Alternatively, the nanoparticle may include particles having a core-shell structure in which the particles are coated on insulative beads or combinations thereof. When the elastic layer EL includes the nanoparticles, the elastic layer EL may operate as a pressure sensor. The elastic layer EL is connected to an external apparatus (not shown), and the external apparatus (not shown) measures a resistance value of the elastic layer EL. When the user applies a touch to the display apparatus and the elastic layer EL is deformed by the touch, the resistance value of the elastic layer EL is changed as a distance between the nanoparticles included in the elastic layer EL is changed. The external apparatus (not shown) may sense a change in resistance value of the elastic layer EL, and determine a pressure of the touch, based on a magnitude of the changed resistance value.

The second conductive pattern CP2 is disposed between the elastic layer EL and the second display layer DPL2. The second conductive pattern CP2 may include at least one of a metal (aluminum, gold, nickel, titanium, platinum, chromium, copper, etc., or any alloy thereof) and a transparent conductive oxide (indium tin oxide, indium zinc oxide, aluminum doped zinc oxide, gallium indium zinc oxide, zinc oxide, etc., or any mixture thereof).

The first conductive pattern CP1, the elastic layer EL, and the second conductive pattern CP2 may operate as a pressure sensor. The first conductive pattern CP1 and the second conductive pattern CP2 are connected to an external apparatus (not shown). The external apparatus (not shown) supplies a preset voltage or current level to the first conductive pattern CP1, and measures voltage and current levels of the second conductive pattern CP2. Based on the voltage or current level of the second conductive pattern CP2, the external apparatus (not shown) measures a capacitance between the first conductive pattern CP1 and the second conductive pattern CP2. When the user applies a touch to the display apparatus and the elastic layer EL is deformed by the touch, a distance between the first conductive pattern CP1 and the second conductive pattern CP2 is changed as the elastic layer EL is deformed. The capacitance between the first conductive pattern CP1 and the second conductive pattern CP2 is changed as the distance between the first conductive pattern CP1 and the second conductive pattern CP2 is changed. The external apparatus (not shown) may sense a change in capacitance between the first conductive pattern CP1 and the second conductive pattern CP2, and calculate a pressure of the touch, based on a magnitude of the changed capacitance.

In some embodiments, the external apparatus (not shown) may supply a preset voltage or current level to the second conductive pattern CP2, and measure voltage and current levels of the first conductive pattern CP1. Also, the external apparatus (not shown) may supply a preset voltage or current level to the first conductive pattern CP1 during a preset period, and supply a preset voltage or current level to the second conductive pattern CP2 during the remaining period. The preset period and the remaining period may be alternately performed.

The second substrate SUB2 is disposed between the first conductive pattern CP1 and the elastic layer EL. The second substrate SUB2 has a front surface and a rear surface. The second substrate SUB2 may allow light to be transmitted therethrough, and have an insulation property. The second substrate SUB2 may include at least one of materials mentioned as the materials that may be included in the first substrate SUB1.

The third substrate SUB3 is disposed between the elastic layer EL and the second conductive pattern CP2. The third substrate SUB3 may allow light to be transmitted therethrough, and have an insulation property. The third substrate SUB3 may include at least one of materials mentioned as the materials that may be included in the first substrate SUB1.

The fourth substrate SUB4 is disposed between the second conductive pattern CP2 and the second display layer DPL2. The fourth substrate SUB4 may allow light to be transmitted therethrough, and have an insulation property. The fourth substrate SUB4 may include at least one of materials mentioned as the materials that may be included in the first substrate SUB1. The second display layer DPL2 may be disposed on the fourth substrate SUB4.

The first buffer layer BF1 is disposed between the first conductive pattern CP1 and the second substrate SUB2. The buffer layer BF1 may be provided in a single layer or a multi-layer. When the first buffer layer BF1 is provided in a single layer, the first buffer layer BF1 may include an organic material or an inorganic material. The organic material may include acryl-based polymer, imide-based polymer, arylether-based polymer, amide-based polymer, fluorine-based polymer, p-xylene-based polymer, and vinyl alcohol-based polymer. The inorganic material may include at least one of a silicon compound and a metal oxide. When the first buffer layer BF1 is provided in a multi-layer, each layer in the multi-layer may include the above-described organic material or an inorganic material.

The second buffer layer BF2 may be disposed between the third substrate SUB3 and the second conductive pattern CP2. Like the first buffer layer BF1, the second buffer layer BF2 may be provided in a single layer or a multi-layer, and include the organic material or an inorganic material, mentioned while describing the first buffer layer BF1.

In the present disclosure, only the first buffer layer BF1 and the second buffer layer BF2 have been illustrated. However, in some embodiments, a buffer layer (not shown) may be further provided between two components different from each other. For example, a buffer layer (not shown) may be further provided between the first substrate SUB1 and the first display layer DPL1. In some embodiments, the first buffer layer BF1 and the second buffer layer BF2 may be omitted.

A detailed structure of the first display layer DPL1 will be described in detail later, and a structure of the second display layer DPL2 may correspond to that of the first display layer DPL1.

Figure 2:
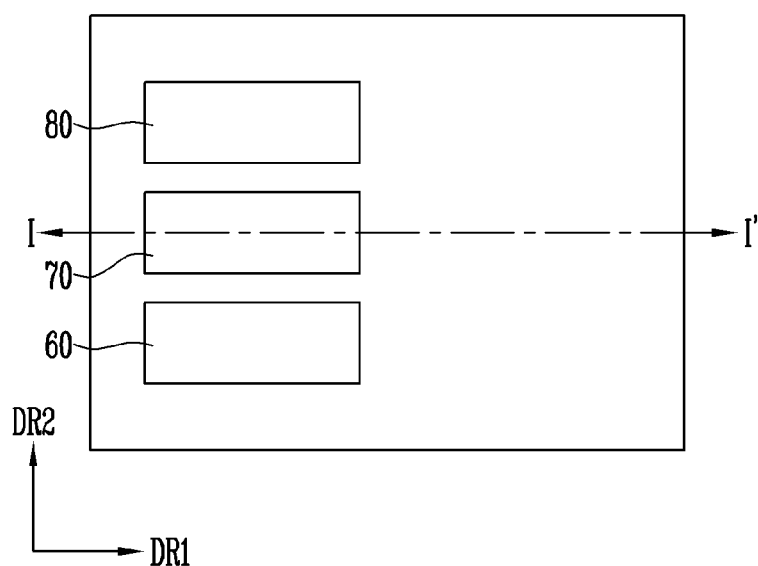
FIG. 2 is a schematic plan view illustrating a portion of the display apparatus of FIG. 1.
Figure 3:
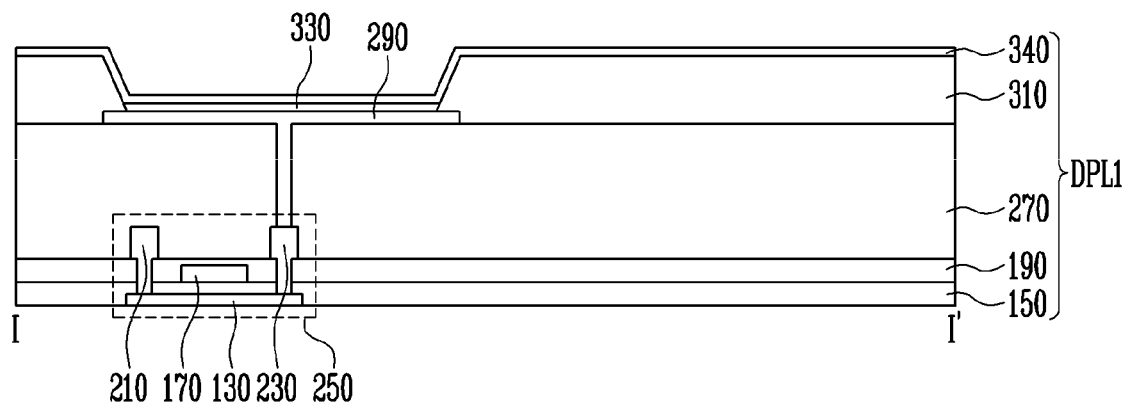
FIG. 3 is a sectional view taken along line I-I' of FIG. 2, which illustrates a first display layer.

FIG. 2 is a schematic plan view illustrating a portion of the display apparatus of FIG. 1. FIG. 3 is a sectional view taken along line I-I' of FIG. 2, which illustrates the first display layer DPL1.

Referring to FIG. 2, pixels 60, 70, and 80 may be disposed in the display apparatus according to the embodiment of the present disclosure. For example, the pixel 60 may be a pixel that emits light of red, the pixel 70 may be a pixel that emits light of green, and the pixel 80 may be a pixel that emits light of blue.

Referring to FIG. 3, in the display apparatus according to the embodiment of the present disclosure, the first display layer DPL1 includes a first insulating layer 150, a second insulating layer 190, a third insulating layer 270, a light emitting structure, and a pixel defining layer 310. Here, the light emitting structure may include a semiconductor device 250, a pixel electrode 290, an emitting layer 330, and a counter electrode 340. The semiconductor device 250 may include an active pattern 130, a gate electrode 170, a source electrode 210, and a drain electrode 230.

The active pattern 130 may include an oxide semiconductor, a silicon semiconductor, an organic semiconductor, or the like. The silicon semiconductor may include amorphous silicon, poly-silicon, etc.

The first insulating layer 150 may be disposed over the active pattern 130. The first insulating layer 150 may include an organic material or an inorganic material. The organic material may include acryl-based polymer, imide-based polymer, arylether-based polymer, amide-based polymer, fluorine-based polymer, p-xylene-based polymer, and vinyl alcohol-based polymer.

The gate electrode 170 may be disposed on the active pattern 130. The gate electrode 170 may include at least one of a metal (aluminum, gold, nickel, titanium, platinum, chromium, copper, etc., or any alloy thereof), a conductive metal nitride, a conductive metal oxide, a transparent conductive material, and the like.

The second insulating layer 190 may be disposed over the gate electrode 170, and cover the gate electrode 170. The second insulating layer 190 may include an organic material or an inorganic material. The organic material may include acryl-based polymer, imide-based polymer, arylether-based polymer, amide-based polymer, fluorine-based polymer, p-xylene-based polymer, and vinyl alcohol-based polymer. The inorganic material may include at least one of a silicon compound and a metal oxide.

The source electrode 210 and the drain electrode 230 may be disposed on the second insulating layer 190. The source electrode 210 and the drain electrode 230 may be connected to one side and the other side of the active pattern 130 by passing through portions of the first insulating layer 150 and the second insulating layer 190, respectively. The source electrode 210 and the drain electrode 230 may include at least one of a metal (aluminum, gold, nickel, titanium, platinum, chromium, copper, etc., or any alloy thereof), a conductive metal nitride, a conductive metal oxide, a transparent conductive material, and the like.

The third insulating layer 270 may be disposed over the second insulating layer 190, the source electrode 210, and the drain electrode 230. The third insulating layer 270 may cover the source electrode 210 and the drain electrode 230. The third insulating layer 270 may include an organic material or an inorganic material. The organic material may include acryl-based polymer, imide-based polymer, arylether-based polymer, amide-based polymer, fluorine-based polymer, p-xylene-based polymer, and vinyl alcohol-based polymer. The inorganic material may include at least one of a silicon compound and a metal oxide.

The pixel electrode 290 may be disposed on the third insulating layer 270. The pixel electrode 290 may be connected to the drain electrode 230 in the semiconductor device 250 by passing through a portion of the third insulating layer 270. In some embodiments, the pixel electrode 290 may be electrically connected to another part (e.g., the source electrode 210) in the semiconductor device 250. The pixel electrode 290 may include at least one of a metal (aluminum, gold, nickel, titanium, platinum, chromium, copper, etc., or any alloy thereof), a conductive metal nitride, a conductive metal oxide, a transparent conductive material, and the like.

The pixel defining layer 310 may be disposed on the third insulating layer 270. The pixel defining layer 310 may be disposed over the pixel electrode 290, and expose a portion of the pixel electrode 290. The pixel defining layer 310 may include an organic material or an inorganic material. The organic material may include acryl-based polymer, imide-based polymer, arylether-based polymer, amide-based polymer, fluorine-based polymer, p-xylene-based polymer, and vinyl alcohol-based polymer. The inorganic material may include at least one of a silicon compound and a metal oxide.

The emitting layer 330 may be disposed on the pixel electrode 290, and be in contact with the pixel electrode 290. The emitting layer 330 may include at least one of light emitting materials that enable different colored lights (e.g., red light, green light, blue light, etc.) to be emitted therefrom. The emitting layer 330 may include an organic material, and be provided in a single layer or a multi-layer. When current flows in the emitting layer 330, the emitting layer 330 may emit light. Referring to FIGS. 2 and 3, the pixel 70 may correspond to a region in which the emitting layer 330 is provided.

The counter electrode 340 may be disposed over the pixel defining layer 310 and the emitting layer 330. The counter electrode 340 may cover the pixel defining layer 310 and the emitting layer 330. The counter electrode 340 may include at least one of a metal (aluminum, gold, nickel, titanium, platinum, chromium, copper, etc., or any alloy thereof), a conductive metal nitride, a conductive metal oxide, a transparent conductive material, and the like.

The second display layer DPL2 (see FIG. 1) may have a structure corresponding to that of the first display layer DPL1.

The display apparatus according to the embodiment of the present disclosure can sense a pressure of a touch while displaying images in front and rear directions.

Figure 4:
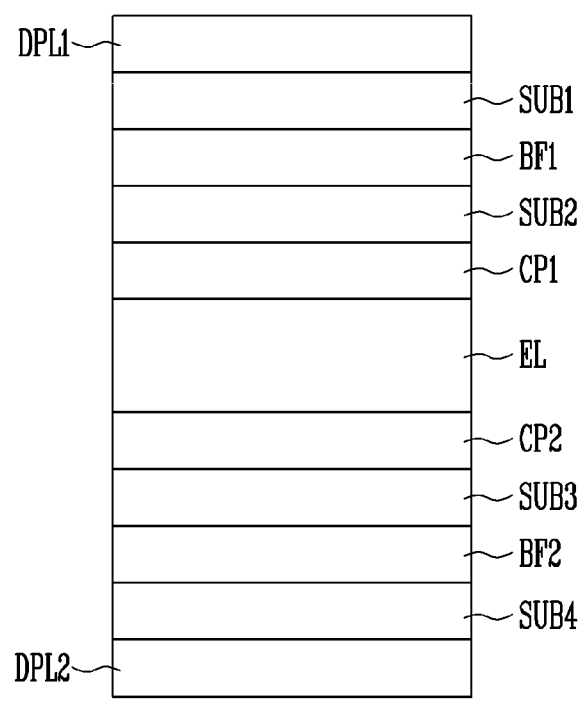
FIG. 4 is a view illustrating a display apparatus according to another embodiment of the present disclosure.

FIG. 4 is a view illustrating a display apparatus according to another embodiment of the present disclosure.

Referring to FIG. 4, the display apparatus according to another embodiment of the present disclosure includes a first substrate SUB1, a first display layer DPL1, a second display layer DPL2, a first conductive pattern CP1, a second substrate SUB2, an elastic layer EL, a third substrate SUB3, a second conductive pattern CP2, a fourth substrate SUB4, a first buffer layer BF1, and a second buffer layer BF2. For convenience of illustration, descriptions of portions identical to those described in FIG. 1 will be omitted.

In FIG. 1, the second substrate SUB2 is disposed between the first conductive pattern CP1 and the elastic layer EL, and the first buffer layer BF1 is disposed between the first conductive pattern CP1 and the second substrate SUB2.

However, in FIG. 4, the second substrate SUB2 is disposed between the first substrate SUB1 and the first conductive pattern CP1, and the first buffer layer BF1 is disposed between the first substrate SUB1 and the second substrate SUB2.

Also, in FIG. 1, the third substrate SUB3 is disposed between the elastic layer EL and the second conductive pattern CP2, and the second buffer BF2 is disposed between the third substrate SUB3 and the second conductive pattern CP2. However, in FIG. 4, the third substrate SUB3 is disposed between the second conductive pattern CP2 and the fourth substrate SUB4, and the second buffer layer BF2 is disposed between the third substrate SUB3 and the fourth substrate SUB4.

Figure 5:
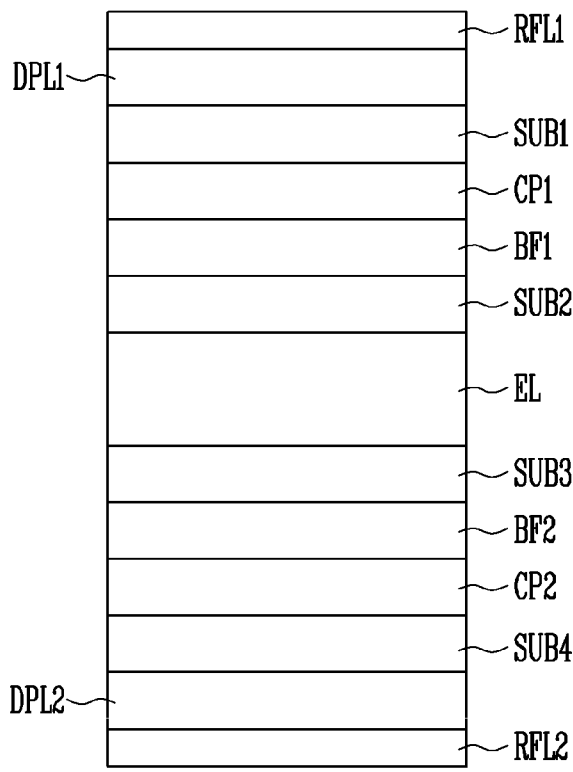
FIG. 5 is a view illustrating a display apparatus according to still another embodiment of the present disclosure.

FIG. 5 is a view illustrating a display apparatus according to still another embodiment of the present disclosure.

Referring to FIG. 5, the display apparatus according to the still another embodiment of the present disclosure includes a first substrate SUB1, a first display layer DPL1, a second display layer DPL2, a first conductive pattern CP1, a second substrate SUB2, an elastic layer EL, a third substrate SUB3, a second conductive pattern CP2, a fourth substrate SUB4, a first buffer layer BF1, a second buffer layer BF2, a first reflective layer RFL1, and a second reflective layer RFL2.

As compared with the display apparatus according to the embodiment shown in FIG. 1, the display apparatus according to the embodiment shown in FIG. 5 further includes the first reflective layer RFL1 and the second reflective layer RFL2.

The first reflective layer RFL1 is disposed on the first display layer DPL1, and the first display layer DPL1 is disposed between the first reflective layer RFL1 and the first substrate SUB1.

The second reflective layer RFL2 is disposed on the second display layer DPL2, and the second display layer DPL2 is disposed between the second reflective layer RFL2 and the fourth substrate SUB4.

A detailed structure of the first reflective layer RFL1 will be described in detail later, and a structure of the second reflective layer RFL2 may correspond to that of the first reflective layer RFL1.

Figure 6:
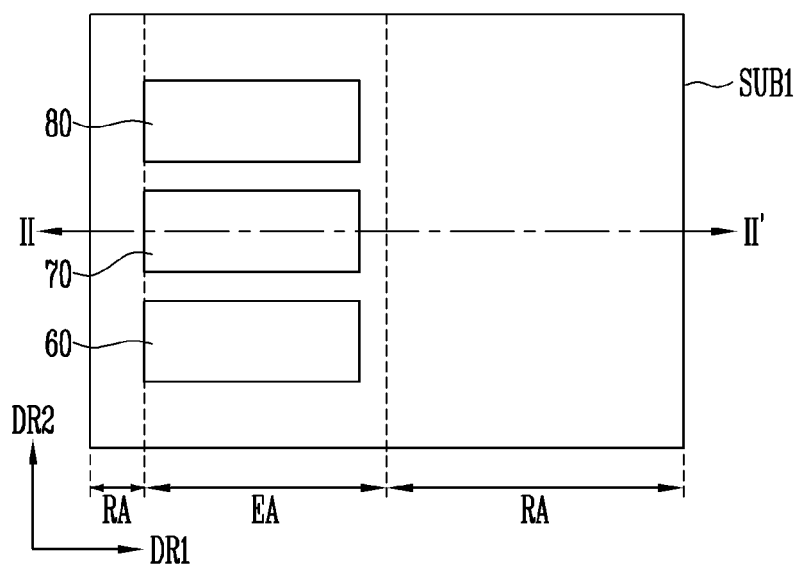
FIG. 6 is a schematic plan view illustrating a portion of the display apparatus of FIG. 5.
Figure 7:
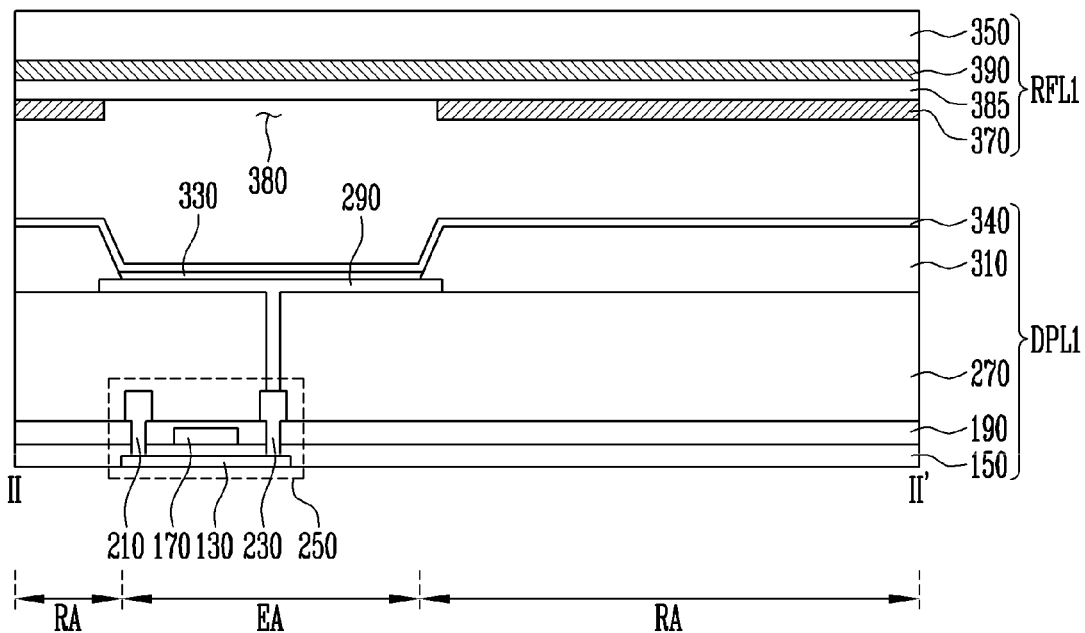
FIG. 7 is a sectional view taken along line II-II' of FIG. 6, which illustrates a first display layer and a first reflective layer.

FIG. 6 is a schematic plan view illustrating a portion of the display apparatus of FIG. 5. FIG. 7 is a sectional view taken along line II-II' of FIG. 6, which illustrates the first display layer and the first reflective layer.

Referring to FIG. 6, in the display apparatus according to the still another embodiment of the present disclosure, the first substrate SUB1 includes a light emitting area EA and a reflective area RA, and pixels 60, 70, and 80 are disposed in the light emitting area EA. An image may be displayed in the light emitting area EA, and an external image may be reflected in the reflective area RA.

Referring to FIG. 7, the first reflective layer RFL1 is disposed on the first display layer DPL1, and includes a reflective pattern 370, a fourth insulating layer 385, and a sensing pattern 390. According to an embodiment, an air layer or optional filler material may be formed between the first reflective layer RFL1 and the first display layer DPL1. The first reflective layer RFL1 may be in contact with the first display layer DPL1, and a buffer layer (not shown) may be provided between the first reflective layer RFL1 and the first display layer DPL1.

The first display layer DPL1 has already been described with reference to FIG. 3. However, the emitting layer 330 may be disposed in the light emitting area EA, and the pixel 70 may correspond to the region in which the emitting layer 330 is provided.

The first reflective layer RFL1 includes a first transparent substrate 350, the sensing pattern 390, the fourth insulating layer 385, and the reflective pattern 370.

The first transparent substrate 350 is disposed on the counter electrode 340. The first transparent substrate 350 may allow light to be transmitted therethrough, and include at least one of materials mentioned as the materials that may be included in the first substrate SUB1. The first transparent substrate 350 may be provided in a multi-layer, and the multi-layer may have a structure in which an organic layer including an organic material and an inorganic layer including an inorganic material are alternately stacked.

The sensing pattern 390 may be disposed between the counter electrode 340 and the first transparent substrate 350, and be provided in the reflective area RA and the light emitting area EA. The sensing pattern 390 may have conductivity. Referring to FIGS. 6 and 7, the sensing pattern 390 may be provided to overlap with the pixel 70. In some embodiments, referring to FIGS. 6 and 7, the sensing pattern 390 may be provided to overlap with the pixels 60, 70, and 80.

The sensing pattern 390 may sense a touch position of a user. Also, the sensing pattern 390 may include a material having a constant reflexibility.

The fourth insulating layer 385 may be disposed between the counter electrode 340 and the sensing pattern 390. The fourth insulating layer 385 may include an adhesive material.

The reflective pattern 370 may be disposed between the counter electrode 340 and the fourth insulating layer 385, and be provided in the reflective area RA. The reflective pattern 370 may include a material having a constant reflexibility, and reflect external light incident into the first display layer DPL1 from the outside. The reflective pattern 370 may include at least one of a metal (aluminum, silver, copper, molybdenum, etc., or any alloy thereof), aluminum nitride, tungsten nitride, chromium nitride, titanium nitride, tantalum nitride, strontium ruthenium oxide, zinc oxide, tin oxide, indium oxide, and gallium oxide. The reflective pattern 370 may have an opening 380, and the opening 380 may be provided in the light emitting area EA. In some embodiments, the reflective pattern 370 may sense a touch position of the user. For example, a capacitance of the reflective pattern 370 may be changed by a touch of the user, and an external apparatus (not shown) connected to the reflective pattern 370 may determine that the touch has occurred in the reflective pattern 370 by sensing the capacitance. That is, the reflective pattern 370 may serve as a sensing electrode of a self-capacitance type. Referring to FIGS. 6 and 7, the reflective pattern 370 may be provided not to overlap with the pixel 70.

Figure 8:
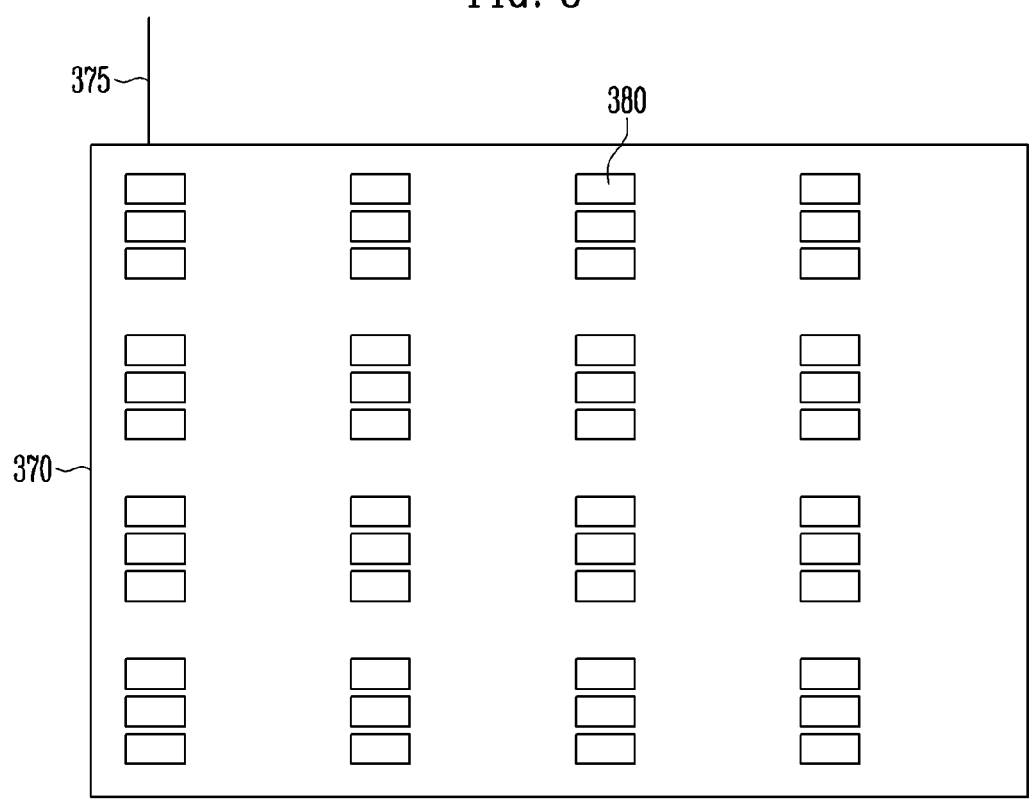
FIG. 8 is a view illustrating an embodiment of a reflective pattern of FIG. 5.

FIG. 8 is a view illustrating an embodiment of the reflective pattern of FIG. 5.

Referring to FIGS. 5, 6, and 8, the reflective pattern 370 may be provided to surround the pixels 60, 70, and 80, and be connected to the external apparatus (not shown) through a first connection line 375. The first connection line 375 may include the same material as the reflective pattern 370, and be provided on the same plane as the reflective pattern 370. However, the present disclosure is not limited thereto. The reflective pattern 370 may be provided in plurality.

Figure 9:
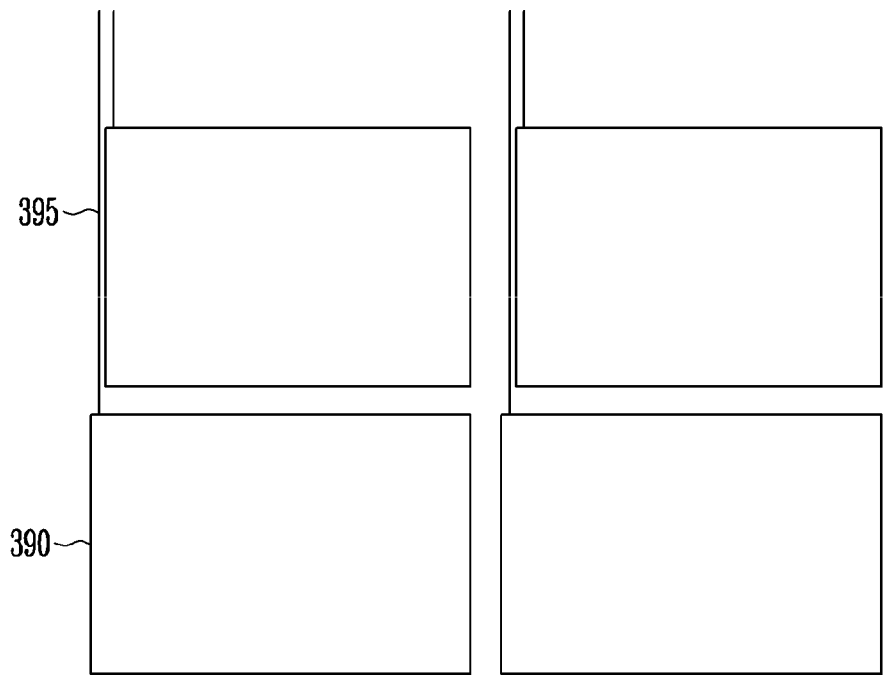
FIG. 9 is a view illustrating an embodiment of a sensing pattern of FIG. 5.

FIG. 9 is a view illustrating an embodiment of the sensing pattern 390 of FIG. 7.

Referring to FIGS. 5, 6, 7, and 9, the sensing pattern 390 may be provided to overlap with the pixels 60, 70, and 80, and be connected to an external apparatus (not shown) through a second connection line 395. The second connection line 395 may include the same material as the sensing pattern 390, and be provided on the same plane as the sensing pattern 390. However, the present disclosure is not limited thereto. The sensing pattern 390 may sense a touch position of the user. For example, a capacitance of the sensing pattern 390 may be changed by a touch of the user, and the external apparatus (not shown) connected to the sensing pattern 390 through the second connection line 395 may determine that the touch has occurred in the sensing pattern 390 by sensing the capacitance. That is, the sensing pattern 390 may serve as a sensing electrode of the self-capacitance type.

Figure 10:
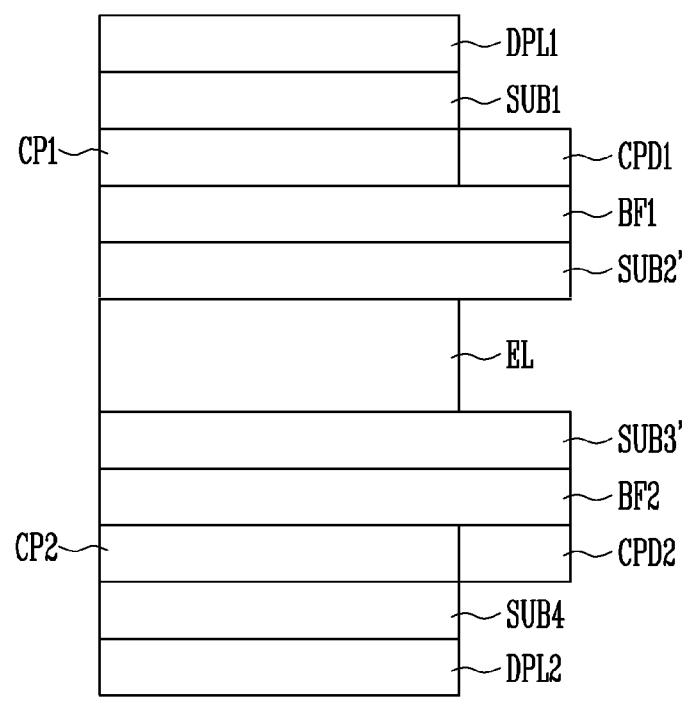
FIG. 10 is a view illustrating a display apparatus according to still another embodiment of the present disclosure.

FIG. 10 is a view illustrating a display apparatus according to still another embodiment of the present disclosure.

Referring to FIG. 10, the display apparatus according to the still another embodiment of the present disclosure includes a first substrate SUB1, a first display layer DPL1, a second display layer DPL2, a first conductive pattern CP1, a second substrate SUB2', an elastic layer EL, a third substrate SUB3', a second conductive pattern CP2, a fourth substrate SUB4, a first buffer layer BF1, a second buffer layer BF2, a first conductive pad CPD1, and a second conductive pad CPD2. For convenience of illustration, descriptions of portions identical to those described in FIG. 1 will be omitted.

Like the second substrate SUB2 (see FIG. 1), the second substrate SUB2' is disposed between the elastic layer EL and the first buffer layer BF1. An area of the second substrate SUB2' is larger than that of first substrate SUB1.

Like the third substrate SUB3 (see FIG. 1), the third substrate SUB3' is disposed between the elastic layer EL and the second buffer layer BF2. An area of the third substrate SUB3' is larger than that of the fourth substrate SUB4.

The first conductive pad CPD1 is provided on the same plane as the first conductive pattern CP1, and is connected to the first conductive pattern CP1. The first conductive pad CPD1 may be connected to an external apparatus (not shown), and connect the external apparatus (not shown) and the first conductive pattern CP1 to each other. The first conductive pad CPD1 may include a bonding pad. The external apparatus (not shown) drives the first conductive pattern CP1.

The second conductive pad CPD2 is provided on the same plane as the second conductive pattern CP2, and is connected to the second conductive pattern CP2. The second conductive pad CPD2 may be connected to an external apparatus (not shown), and connect the external apparatus (not shown) and the second conductive pattern CP2 to each other. The second conductive pad CPD2 may include a bonding pad. The external apparatus (not shown) drives the second conductive pattern CP2.

Figure 11:
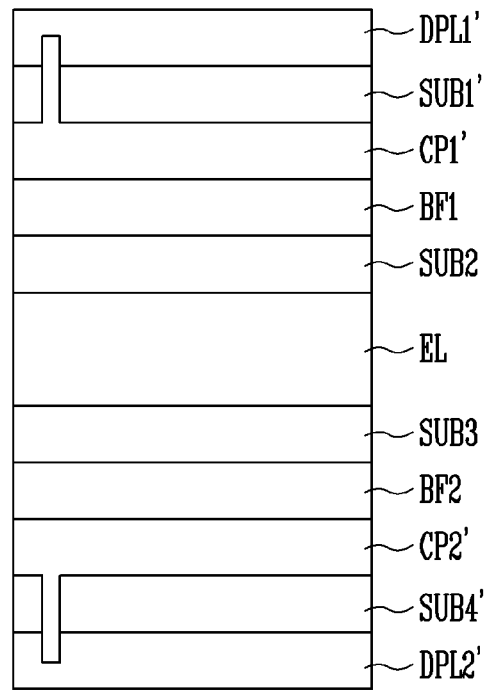
FIG. 11 is a view illustrating a display apparatus according to still another embodiment of the present disclosure.

FIG. 11 is a view illustrating a display apparatus according to still another embodiment of the present disclosure.

Referring to FIG. 11, the display apparatus according to the still another embodiment of the present disclosure includes a first substrate SUB1', a first display layer DPL1', a second display layer DPL2', a first conductive pattern CP1', a second substrate SUB2, an elastic layer EL, a third substrate SUB3, a second conductive pattern CP2', a fourth substrate SUB4', a first buffer layer BF1, and a second buffer layer BF2. For convenience of illustration, descriptions of portions identical to those described in FIG. 1 will be omitted.

Unlike the first substrate SUB1 (see FIG. 1), the first substrate SUB1' has a first via hole.

Unlike the fourth substrate SUB4 (see FIG. 1), the fourth substrate SUB4' has a second via hole.

The first conductive pattern CP1' is connected to the first display layer DPL1' through the first via hole. In addition, the first conductive pattern CP1' is connected to an external apparatus (not shown) through the first via hole. The external apparatus (not shown) drives not only the first display layer DPL1' but also the first conductive pattern CP1'.

The second conductive pattern CP2' is connected to the second display layer DPL2' through the second via hole. In addition, the second conductive pattern CP2' is connected to an external apparatus (not shown) through the second via hole. The external apparatus (not shown) drives not only the second display layer DPL2' but also the second conductive pattern CP2'.

Figure 12:
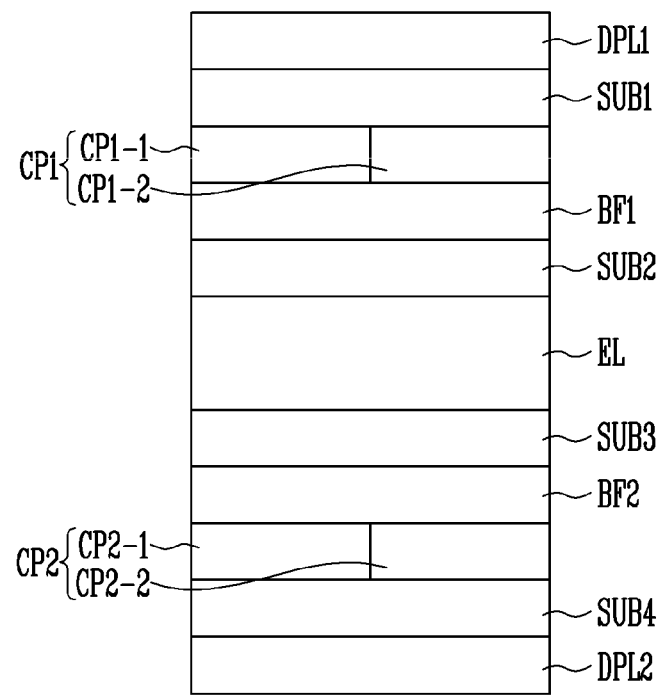
FIG. 12 is a view illustrating a display apparatus according to still another embodiment of the present disclosure.

FIG. 12 is a view illustrating a display apparatus according to still another embodiment of the present disclosure.

Referring to FIG. 12, the display apparatus according to the still another embodiment of the present disclosure includes a first substrate SUB1, a first display layer DPL1, a second display layer DPL2, a first conductive pattern CP1, a second substrate SUB2, an elastic layer EL, a third substrate SUB3, a second conductive pattern CP2, a fourth substrate SUB4, a first buffer layer BF1, and a second buffer layer BF2. For convenience of illustration, descriptions of portions identical to those described in FIG. 1 will be omitted.

In the embodiment shown in FIG. 12, the first conductive pattern CP1 is provided with a plurality of first conductive patterns CP1-1 and CP1-2 that do not overlap with each other, and the second conductive pattern CP2 is provided with a plurality of second conductive patterns CP2-1 and CP2-2 that do not overlap with each other.

Each of the first conductive patterns CP1-1 and CP1-2 and each of the second conductive patterns CP2-1 and CP2-2 are connected to an external apparatus (not shown).

During a preset period, the external apparatus (not shown) may supply a preset voltage or current level to the first conductive pattern CP1-1 and the second conductive pattern CP2-2, and measure voltage and current levels of the first conductive pattern CP1-2 and the second conductive pattern CP2-1. During the remaining period, the external apparatus (not shown) may supply a preset voltage or current level to the first conductive pattern CP1-2 and the second conductive pattern CP2-1, and measure voltage and current levels of the first conductive pattern CP1-1 and the second conductive pattern CP2-2. The preset period and the remaining period may be alternately performed.

A length of the preset period and a length of the remaining period may be sufficiently short as compared with a period in which a touch of the user is maintained. Voltage and current levels of the first conductive patterns CP1-1 and CP1-2 and the second conductive patterns CP2-1 and CP2-2 may be measured at least once during a period in which the user applies a touch.

Figure 13:
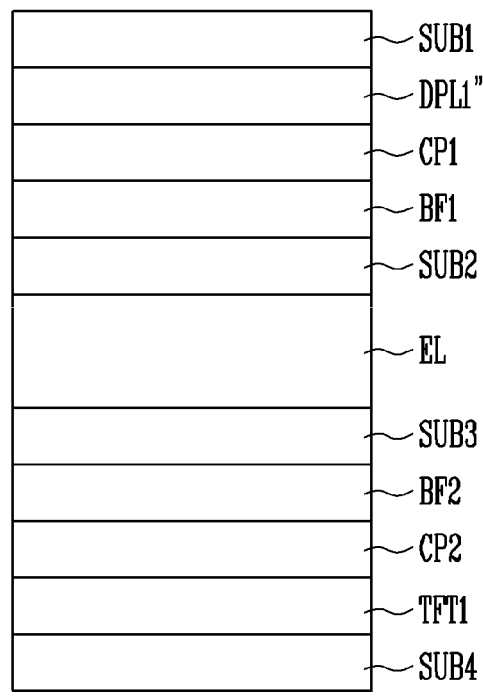
FIG. 13 is a view illustrating a display apparatus according to still another embodiment of the present disclosure.

FIG. 13 is a view illustrating a display apparatus according to still another embodiment of the present disclosure.

Referring to FIG. 13, the display apparatus according to the still another embodiment of the present disclosure includes a first substrate SUB1, a first display layer DPL1", a first conductive pattern CP1, a first buffer layer BF1, a second substrate SUB2, an elastic layer EL, a third substrate SUB3, a second buffer layer BF2, a second conductive pattern CP2, a first transistor TFT1, and a fourth substrate SUB4. For convenience of illustration, descriptions of portions identical to those described in FIG. 1 will be omitted.

The first substrate SUB1 may have a front surface and a rear surface, and have flexibility.

The fourth substrate SUB4 is disposed on the rear surface of the first substrate SUB1. The fourth substrate SUB4 may have a front surface and a rear surface, and have flexibility.

The first display layer DPL1" is disposed on the rear surface of the first substrate SUB1, and is provided between the first substrate SUB1 and the fourth substrate SUB4. The first display layer DPL1" may include at least one of the pixel electrode 290, the pixel defining layer 310, the emitting layer 330, and the counter electrode 340 in the first display layer DPL1 shown in FIG. 3.

The first transistor TFT1 may be disposed between the first display layer DPL1" and the fourth substrate SUB4, and drive the first display layer DPL1". The first transistor TFT1 may include at least one of the first insulating layer 150, the semiconductor device 250, and the third insulating layer 270 in the first display layer DPL1 shown in FIG. 3.

Figure 14:
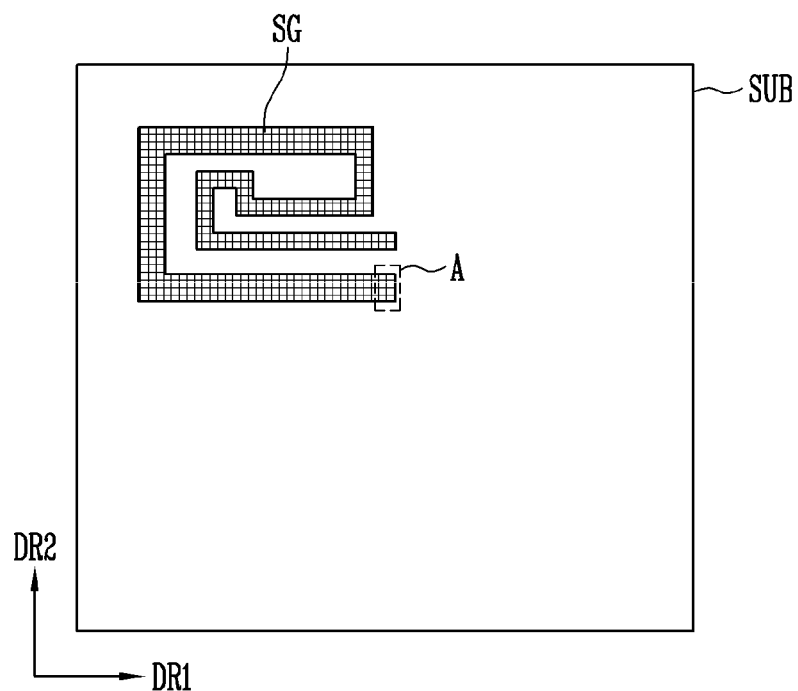
FIG. 14 is a schematic plan view illustrating a display apparatus according to still another embodiment of the present disclosure.
Figure 15:
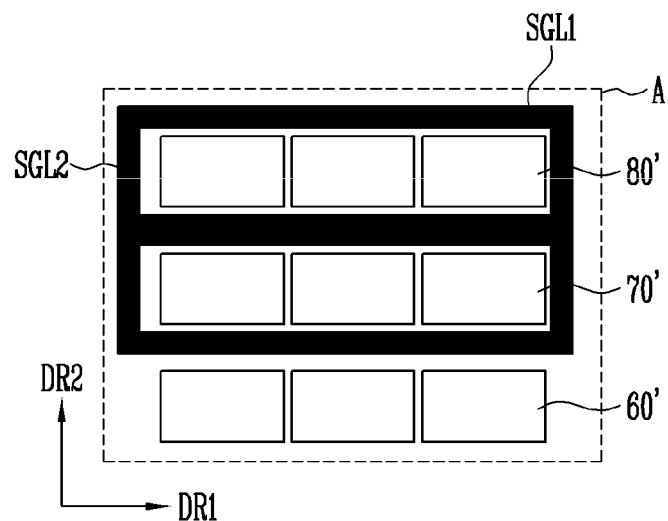
FIG. 15 is an enlarged view of portion A of FIG. 14.

FIG. 14 is a schematic plan view illustrating a display apparatus according to still another embodiment of the present disclosure. FIG. 15 is an enlarged view of portion A of FIG. 14.

Referring to FIGS. 14 and 15, the display apparatus according to the still another embodiment of the present disclosure includes a substrate SUB, a pressure sensor SG, and pixels 60', 70', and 80'.

The substrate SUB may be the substantially same as the first substrate SUB1 (see FIG. 1).

The pressure sensor SG may be provided on the substrate SUB, and have elasticity. The pressure sensor SG may include a strain gauge. When the pressure sensor SG includes a strain gauge, the portion A may include one end of the strain gauge. When a stress is generated, the strain gauge may be deformed, and a resistance value between both ends of the strain gauge may be changed as the strain gauge is deformed. Although only one pressure sensor SG is illustrated in FIG. 14, the pressure sensor SG may be provided in plurality, and the plurality of pressure sensors may be disposed at different positions in the substrate SUB. When a resistance value of one of the plurality of pressure sensors is changed, an external apparatus (not shown) connected to the pressure sensor SG may determine a position of a touch, based on the position of the pressure sensor of which resistance value is changed.

The pressure sensor SG may have a grid type pattern so as not to overlap with the pixels 60', 70', and 80'. The grid type pattern includes a first pressure sensor line SGL1 extending in a first direction DR1 and a second pressure sensor line SGL2 extending a second direction DR2 intersecting the first direction DR1.

Figure 16:
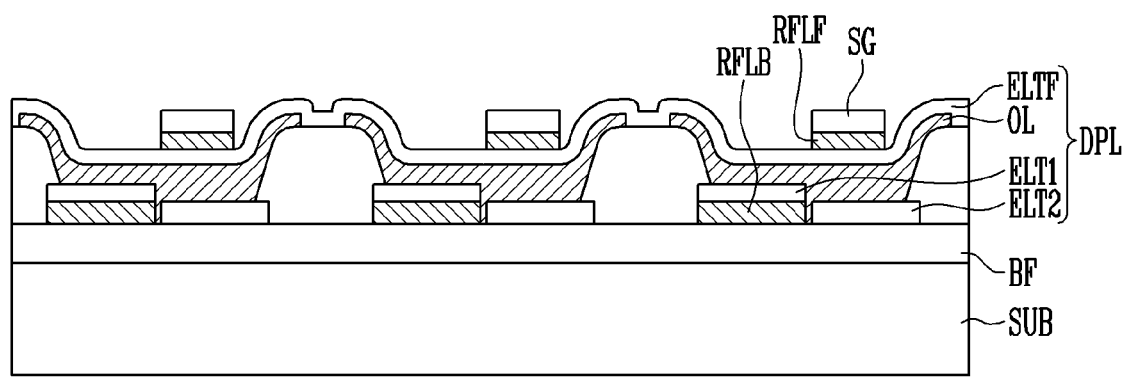
FIG. 16 is a view illustrating a display apparatus according to still another embodiment of the present disclosure.

FIG. 16 is a view illustrating a display apparatus according to still another embodiment of the present disclosure.

Referring to FIG. 16, the display apparatus according to the still another embodiment of the present disclosure includes a substrate SUB, a buffer layer BF, a display layer DPL, a rear reflective layer RFLB, a front reflective layer RFLF, and a pressure sensor SG.

The substrate SUB has a front surface and a rear surface. The substrate SUB may allow light to be transmitted therethrough, and have an insulation property. The substrate SUB may include at least one of materials mentioned as the materials that may be included in the first substrate SUB1 (see FIG. 1).

The buffer layer BF is disposed on the front surface of the substrate SUB. The buffer layer BF may be provided in a single layer or a multi-layer. When the buffer layer BF is provided in a single layer, the buffer layer BF may include an organic material or an inorganic material. The organic material may include acryl-based polymer, imide-based polymer, arylether-based polymer, amide-based polymer, fluorine-based polymer, p-xylene-based polymer, and vinyl alcohol-based polymer. The inorganic material may include at least one of a silicon compound and a metal oxide. When the buffer layer BF is provided in a multi-layer, each layer in the multi-layer may include the above-described organic material or an inorganic material.

The display layer DPL includes a first pixel electrode ELT1, a second pixel electrode ELT2, a counter electrode ELTF, and an emitting layer OL.

The first pixel electrode ELT1 is disposed on the buffer layer BF. The first pixel electrode ELT1 may include at least one of a metal (aluminum, gold, nickel, titanium, platinum, chromium, copper, etc., or any alloy thereof) having ductility and a transparent conductive oxide (indium tin oxide, indium zinc oxide, aluminum doped zinc oxide, gallium indium zinc oxide, zinc oxide, etc., or any mixture thereof) having no ductility.

The second pixel electrode ELT2 is disposed on the buffer layer BF. The second pixel electrode ELT2 may include at least one of a metal (aluminum, gold, nickel, titanium, platinum, chromium, copper, etc., or any alloy thereof) having ductility and a transparent conductive oxide (indium tin oxide, indium zinc oxide, aluminum doped zinc oxide, gallium indium zinc oxide, zinc oxide, etc., or any mixture thereof) having no ductility.

The counter electrode ELTF is disposed on the first pixel electrode ELT1 and the second pixel electrode ELT2. The counter electrode ELTF may include at least one of materials mentioned as the materials that may be included in the first pixel electrode ELT1.

The emitting layer OL may be disposed between the first pixel electrode ELT1 and the counter electrode ELTF, and be disposed between the second pixel electrode ELT2 and the counter electrode ELTF. The emitting layer OL may include at least one of light emitting materials that enable different colored lights (i.e., red light, green light, blue light, etc.) to be emitted therefrom. The emitting layer OL may include an organic material, and be provided in a single layer or a multi-layer. When current flows in the emitting layer OL, the emitting layer OL may emit light.

The rear reflective layer RFLB is disposed between the buffer layer BF and the first pixel electrode ELT1. The rear reflective layer RFLB may include at least one of a metal (aluminum, silver, copper, molybdenum, etc., or any alloy thereof), aluminum nitride, tungsten nitride, chromium nitride, titanium nitride, tantalum nitride, strontium ruthenium oxide, zinc oxide, tin oxide, indium oxide, and gallium oxide. The rear reflective layer RFLB reflects, in a front direction, light advancing in a rear direction among lights emitted from the emitting layer OL.

The front reflective layer RFLF is disposed on the counter electrode ELTF. The front reflective layer RFLF may include at least one of a metal (aluminum, silver, copper, molybdenum, etc., or any alloy thereof), aluminum nitride, tungsten nitride, chromium nitride, titanium nitride, tantalum nitride, strontium ruthenium oxide, zinc oxide, tin oxide, indium oxide, and gallium oxide. The front reflective layer RFLF reflects, in a rear direction, light advancing in a front direction among lights emitted from the emitting layer OL.

The pressure sensor SG is disposed on the front reflective layer RFLF.

FIG. 16 may correspond to a sectional view obtained by cutting the pixels 60', 70', and 80' in FIG. 15. The pixels 60', 70', and 80' in FIG. 15 may correspond to a region in which the rear reflective layer RFLB is formed in FIG. 16.

Figure 17:
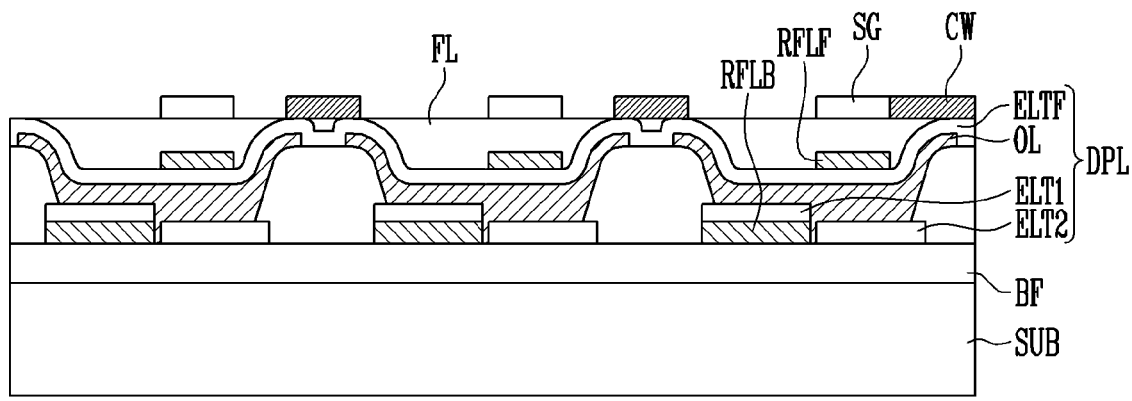
FIG. 17 is a view illustrating a display apparatus according to still another embodiment of the present disclosure.

FIG. 17 is a view illustrating a display apparatus according to still another embodiment of the present disclosure.

Referring to FIG. 17, the display apparatus according to the still another embodiment of the present disclosure includes a substrate SUB, a buffer layer BF, a display layer DPL, a rear reflective layer RFLB, a front reflective layer RFLF, a pressure sensor SG, a planarization layer FL, and a connection line CW. For convenience of illustration, descriptions of portions identical to those described in FIG. 16 will be omitted.

As compared with the display apparatus according to the embodiment shown in FIG. 16, the display apparatus according to the embodiment shown in FIG. 17 further includes the planarization layer FL and the connection line CW.

The planarization layer FL is disposed over the counter electrode ELTF and the front reflective layer RFLF. The planarization layer FL may have an insulation property, and be provided in a single layer or a multi-layer. When the planarization layer FL is provided in a single layer, the planarization layer FL may include an organic material or an inorganic material. The organic material may include acryl-based polymer, imide-based polymer, arylether-based polymer, amide-based polymer, fluorine-based polymer, p-xylene-based polymer, and vinyl alcohol-based polymer. The inorganic material may include at least one of a silicon compound and a metal oxide. When the planarization layer FL is provided in a multi-layer, each layer in the multi-layer may include the above-described organic material or an inorganic material.

The pressure sensor SG is disposed on the planarization layer FL. The pressure sensor SG may overlap with the front reflective layer RFLF. In some embodiments, the pressure sensor SG may be disposed between the planarization layer FL and the front reflective layer RFLF.

The connection line CW may be disposed on the same plane as the pressure sensor SG and be disposed on the planarization layer FL. The connection line CW may not overlap with the rear reflective layer RFLB. At least one portion of the connection line CW may be connected to the pressure sensor SG.

Both ends of the pressure sensor SG may be connected to side surfaces of the substrate SUB, respectively. The side surfaces of the substrate SUB may be connected to an external apparatus (not shown). The pressure sensor SG may be connected to the external apparatus (not shown) through the connection line CW, and the external apparatus (not shown) may measure a voltage value between both the ends of the pressure sensor SG. In some embodiments, the connection line CW may allow light to be transmitted therethrough. In this case, the connection line CW may be provided to overlap with the rear reflective layer RFLB.

Figure 18:
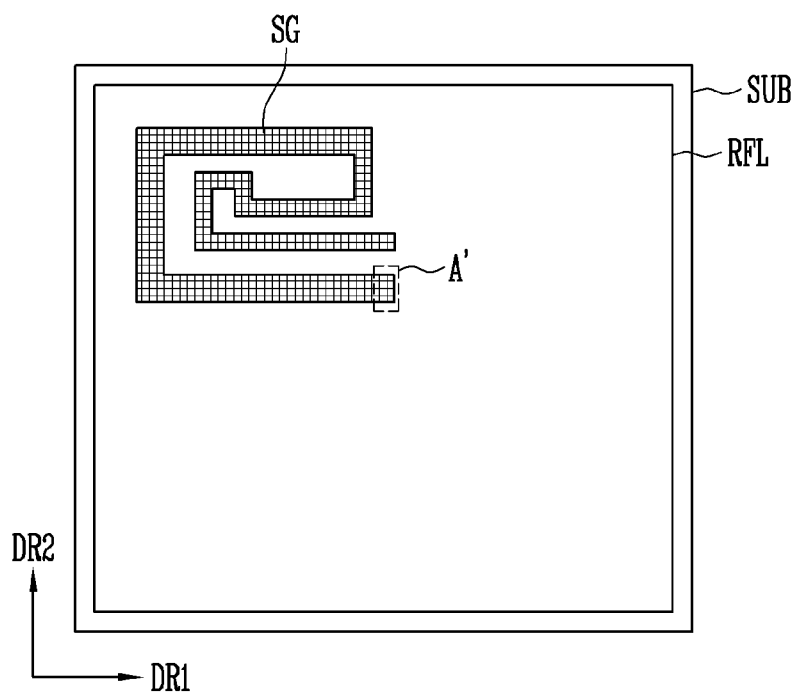
FIG. 18 is a schematic plan view illustrating a display apparatus according to still another embodiment of the present disclosure.
Figure 19:
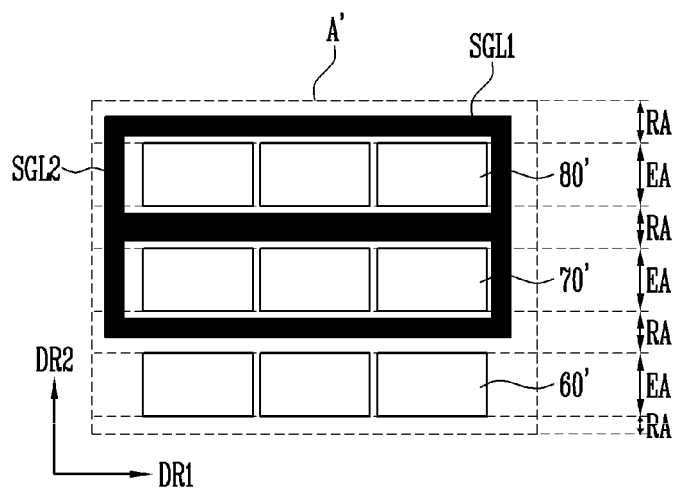
FIG. 19 is an enlarged view of portion A' of FIG. 18.

FIG. 18 is a schematic plan view illustrating a display apparatus according to still another embodiment of the present disclosure. FIG. 19 is an enlarged view of portion A' of FIG. 18.

Referring to FIGS. 18 and 19, the display apparatus according to the still another embodiment of the present disclosure includes a substrate SUB, a reflective layer RFL, a pressure sensor SG and pixels 60', 70', and 80'.

As compared with the display apparatus according to the embodiment shown in FIGS. 14 and 15, the display apparatus according to the embodiment shown in FIGS. 18 and 19 further includes the reflective layer RFL. As described with reference with FIGS. 14 and 15, when the pressure sensor SG includes a strain gauge, the portion A' may include one end of the strain gauge.

The reflective layer RFL may be formed on a portion of the substrate SUB, and overlap with the pressure sensor SG. The reflective layer RFL may allow at least some of lights emitted from the pixels 60', 70', and 80' to be transmitted to the outside (not shown) therethrough, and include a material having a constant reflexibility. A detailed structure of the reflective layer RFL will be described in detail later with reference to FIG. 20.

The substrate SUB may include a light emitting area EA and a reflective area RA, and the pixels 60', 70', and 80' may be disposed in the light emitting area EA.

Figure 20:
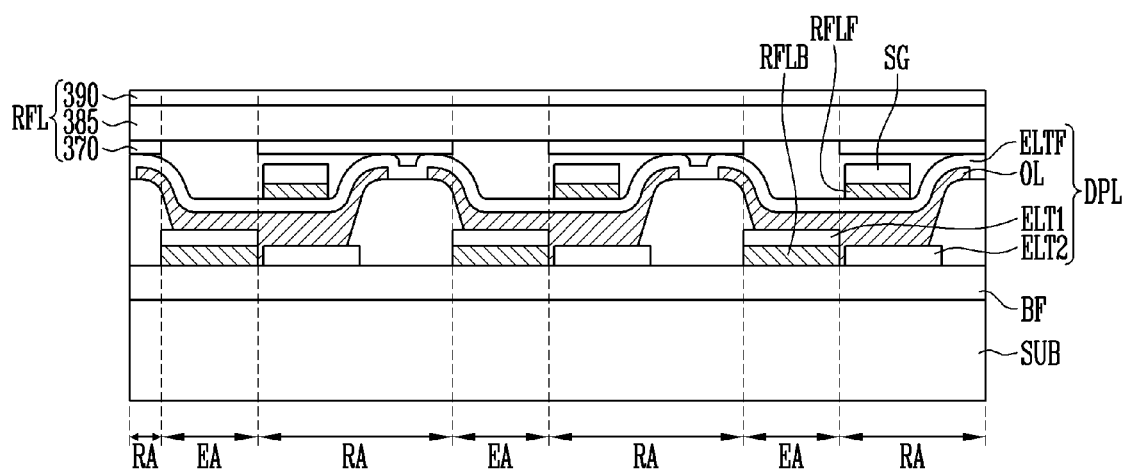
FIG. 20 is a view illustrating a display apparatus according to still another embodiment of the present disclosure.

FIG. 20 is a view illustrating a display apparatus according to still another embodiment of the present disclosure.

Referring to FIG. 20, the display apparatus according to the still another embodiment of the present disclosure includes a substrate SUB, a buffer layer BF, a display layer DPL, a rear reflective layer RFLB, a front reflective layer RFLF, a pressure sensor SG, and a reflective layer RFL. For convenience of illustration, descriptions of portions identical to those described in FIG. 16 will be omitted.

As compared with the display apparatus according to the embodiment shown in FIG. 16, the display apparatus according to the embodiment shown in FIG. 20 further includes the reflective layer RFL.

The reflective layer RFL includes a reflective pattern 370, an insulating layer 385, and a sensing pattern 390.

The reflective pattern 370 may be disposed on the counter electrode ELTF, and be provided in the reflective area RA. The reflective pattern 370 may include a material having a constant reflexibility, and reflect external light incident into the display layer DPL from the outside. The reflective pattern 370 may include at least one of a metal (aluminum, silver, copper, molybdenum, etc., or any alloy thereof), aluminum nitride, tungsten nitride, chromium nitride, titanium nitride, tantalum nitride, strontium ruthenium oxide, zinc oxide, tin oxide, indium oxide, and gallium oxide. In some embodiments, the reflective pattern 370 may sense a touch position of the user. For example, a capacitance of the reflective pattern 370 may be changed by a touch of the user, and an external apparatus (not shown) connected to the reflective pattern 370 may determine that the touch has occurred in the reflective pattern 370 by sensing the capacitance. That is, the reflective pattern 370 may serve as a sensing electrode of the self-capacitance type. An embodiment of the shape of the reflective pattern 370 has already been described with reference to FIG. 8.

The insulating layer 385 may be disposed on the reflective pattern 370. The insulating layer 385 may include an adhesive material.

The sensing pattern 390 is disposed on the insulating layer 385, and is provided in the reflective area RA and the light emitting area EA. The sensing pattern 390 may sense a touch position of the user. For example, a capacitance of the sensing pattern 390 may be changed by a touch of the user, and the external apparatus (not shown) connected to the sensing pattern 390 through the second connection line 395 may determine that the touch has occurred in the sensing pattern 390 by sensing the capacitance. That is, the sensing pattern 390 may serve as a sensing electrode of the self-capacitance type. The sensing pattern 390 may include a material having a constant reflexibility. An embodiment of the shape of the sensing pattern 390 has already been described with reference to FIG. 9.

In some embodiments, like the first reflective layer RFL1 (see FIG. 7), the reflective layer RFL may further include a transparent substrate (not shown) similar to the first transparent substrate 350.

FIG. 20 may correspond to a sectional view obtained by cutting the pixels 60', 70', and 80' in FIG. 19. The pixels 60', 70', and 80' in FIG. 19 may be provided in the light emitting area EA in FIG. 20.

Figure 21:
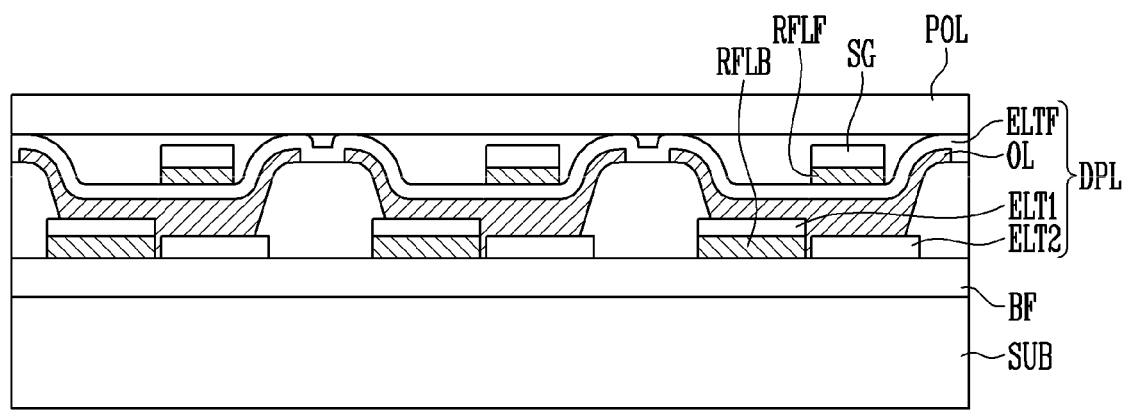
FIG. 21 is a view illustrating a display apparatus according to still another embodiment of the present disclosure.

FIG. 21 is a view illustrating a display apparatus according to still another embodiment of the present disclosure.

Referring to FIG. 21, the display apparatus according to still another embodiment of the present disclosure includes a substrate SUB, a buffer layer BF, a display layer DPL, a rear reflective layer RFLB, a front reflective layer RFLF, a pressure sensor SG, and a polarizing layer POL. For convenience of illustration, descriptions of portions identical to those described in FIG. 16 will be omitted.

As compared with the display apparatus according to the embodiment shown in FIG. 16, the display apparatus according to the embodiment shown in FIG. 21 further includes the polarizing layer POL.

The polarizing layer POL is disposed on the counter electrode ELTF. The polarizing layer POL may include a circular polarizing plate. Here, the circular polarizing plate may include a polarizing plate (not shown) and a phase retardation plate (not shown). When light from the outside is reflected by at least one of the counter electrode ELTF, the front reflective layer RFLF, the first pixel electrode ELT1, and the second pixel electrode ELT2, the polarizing layer POL prevents the reflected light from reaching the user. As the polarizing layer POL is added, outside visibility can be improved.

The display apparatus according to the embodiment shown in FIG. 21 may further include the planarization layer FL shown in FIG. 17. The display apparatus according to the embodiment shown in FIG. 21 may further include the connection line CW shown in FIG. 17.

FIGS. 22A, 22B, 22C, and 22D are views illustrating embodiments of portable electronic apparatuses including the display apparatuses according to the embodiments of the present disclosure.

Figure 22A:
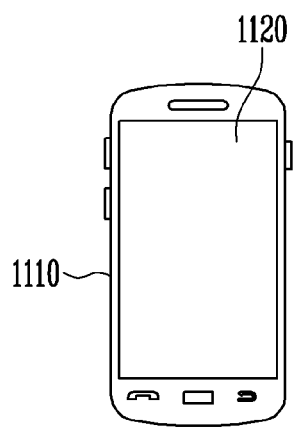
FIGS. 22A, 22B, 22C, and 22D are views illustrating embodiments of portable electronic apparatuses including the display apparatuses according to the embodiments of the present disclosure.

FIG. 22A illustrates an embodiment of a mobile phone 1110 including a display apparatus 1120. The mobile phone 1110 may include at least one of a feature phone and a smart phone.

Figure 22B:
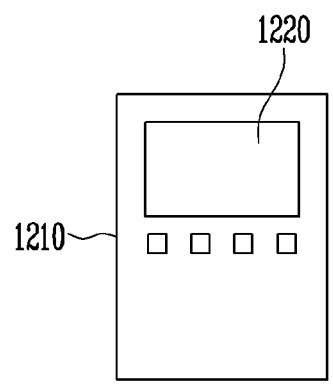

FIG. 22B illustrates an embodiment of a digital media player 1210 including a display apparatus 1220. The digital media player 1210 may include an MP3 player, and the like.

Figure 22C:
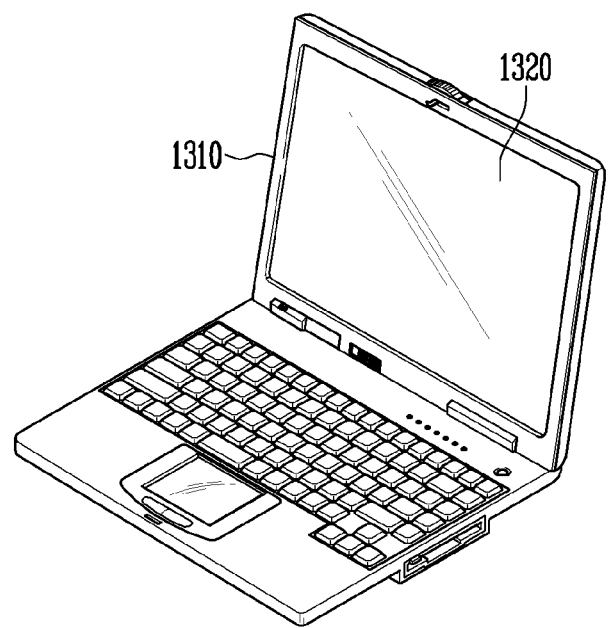

FIG. 22C illustrates an embodiment of a portable computer 1310 including a display apparatus 1320. The portable computer 1310 may include a notebook computer, and the like.

Figure 22D:
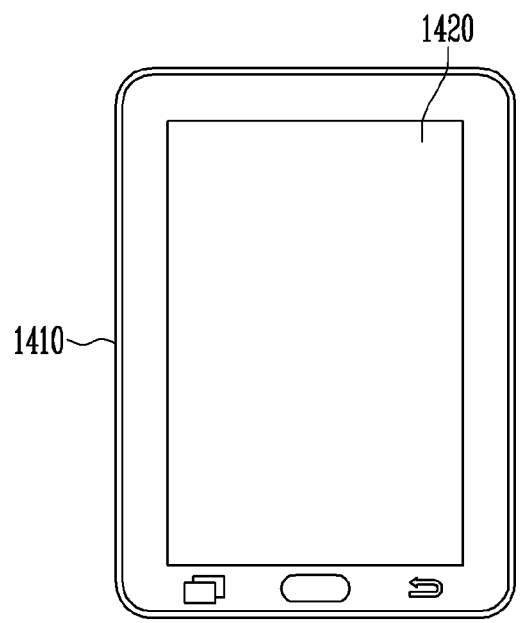

FIG. 22D illustrates an embodiment of a tablet computer 1410 including a display apparatus 1420.

Figure 23A:
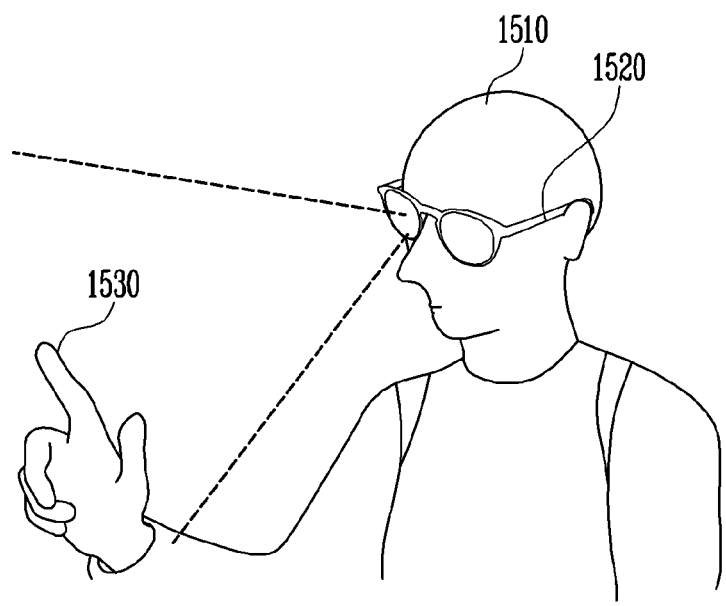
FIGS. 23A, 23B, and 23C are views illustrating embodiments of wearable electronic apparatuses including the display apparatuses according to the embodiments of the present disclosure.
Figure 23B:
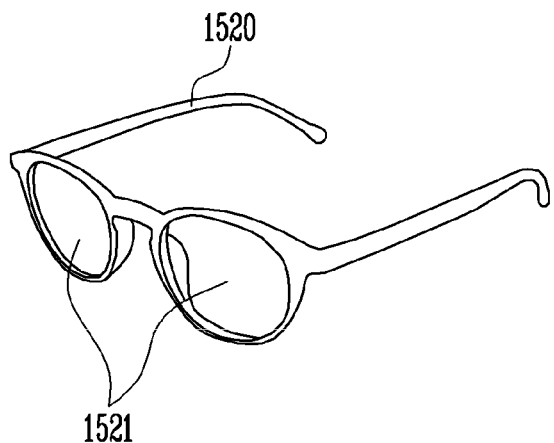
Figure 23C:
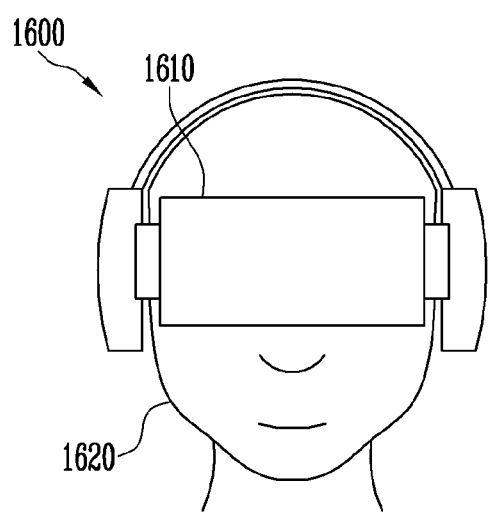

FIGS. 23A, 23B, and 23C are views illustrating embodiments of wearable electronic apparatuses including the display apparatuses according to the embodiments of the present disclosure.

FIG. 23A is a view illustrating an embodiment of an electronic apparatus worn by a user. The user 1510 may wear the electronic apparatus 1520, determine an operation that the user 1510 desires by recognizing the position of a finger 1530, and perform the determined operation. The electronic apparatus 1520 may include a glass type display.

FIG. 23B is a view illustrating the electronic apparatus 1520 of FIG. 23A. The electronic apparatus 1520 may include a display apparatus 1521.

FIG. 23C illustrates an electronic apparatus 1600 including a display apparatus 1610.

The electronic apparatus 1600 may include a head mounted display (HMD) capable of being worn on the head of a user 1620.

According to the present disclosure, it is possible to provide a display apparatus that provides visual information in various directions and measure a pressure of a touch.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display apparatus, comprising:
   a first substrate having a front surface and a rear surface, the first substrate including a light emitting area and a reflective area;
   a first display layer disposed on the front surface of the first substrate, the first display layer configured to emit a first light in a front direction;
   a second display layer disposed on the rear surface of the first substrate, the second display layer configured to emit a second light in a rear direction;
   a pressure sensor disposed between the first substrate and the second display layer, the pressure sensor configured to sense a pressure of a touch of a user, wherein the pressure sensor includes:
      an elastic layer disposed between the first display layer and the second display layer, the elastic layer being configured to be deformed by the pressure;
      at least one first conductive pattern disposed between the first display layer and the elastic layer; and
      at least one second conductive pattern disposed between the elastic layer and the second display layer; and
   a first reflective layer disposed on the first display layer, wherein the first reflective layer includes:
      a reflective pattern disposed in the reflective area only, the reflective pattern configured to reflect light, and
      a sensing pattern disposed in the light emitting area and the reflective area, the sensing pattern including a material having a constant reflexibility,
   wherein the reflective pattern overlaps with the sensing pattern and is physically disconnected from the reflective pattern.

2. The display apparatus of claim 1, wherein the elastic layer includes nanoparticles having conductivity.

3. The display apparatus of claim 1, wherein the at least one first conductive pattern is disposed between the first substrate and the elastic layer.

4. The display apparatus of claim 3, further comprising:
   a second substrate disposed between the first substrate and the first conductive pattern;
   a third substrate disposed between the elastic layer and the second display layer; and
   a fourth substrate disposed between the third substrate and the second display layer.

5. The display apparatus of claim 3, wherein each of the at least one first conductive pattern and the at least one second conductive pattern is provided in plurality.

6. The display apparatus of claim 1, further comprising:
a second substrate disposed between the at least one first conductive pattern and the elastic layer;
a third substrate disposed between the elastic layer and the at least one second conductive pattern; and
a fourth substrate disposed between the at least one second conductive pattern and the second display layer.

7. The display apparatus of claim 6, wherein an area of the second substrate is larger than an area of the first substrate, wherein an area of the third substrate is larger than an area of the fourth substrate, and wherein the display apparatus further comprises:
a first conductive pad provided on a same plane as the at least one first conductive pattern, the first conductive pad being connected to the at least one first conductive pattern; and
a second conductive pad provided on a same plane as the at least one second conductive pattern, the second conductive pad being connected to the at least one second conductive pattern.

8. The display apparatus of claim 6, wherein the first substrate has a first via hole,
wherein the fourth substrate has a second via hole,
wherein the at least one first conductive pattern is connected to the first display layer through the first via hole, and wherein the at least one second conductive pattern is connected to the second display layer through the second via hole.

9. The display apparatus of claim 1,
wherein the first display layer is disposed between the first substrate and the first reflective layer.

10. The display apparatus of claim 9, wherein the sensing pattern is configured to sense a position of the touch.

11. The display apparatus of claim 1, wherein the first reflective layer comprises an opening provided in the light emitting area.

12. The display apparatus of claim 10, wherein the first reflective layer further includes:
an insulating layer between the sensing pattern and the reflective pattern.

* * * * *